US006977801B2

(12) United States Patent
Carey et al.

(10) Patent No.: US 6,977,801 B2
(45) Date of Patent: Dec. 20, 2005

(54) MAGNETORESISTIVE DEVICE WITH EXCHANGE-COUPLED STRUCTURE HAVING HALF-METALLIC FERROMAGNETIC HEUSLER ALLOY IN THE PINNED LAYER

(75) Inventors: Matthew J. Carey, San Jose, CA (US); Jeffrey R. Childress, San Jose, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 289 days.

(21) Appl. No.: 10/374,819

(22) Filed: Feb. 24, 2003

(65) Prior Publication Data

US 2004/0165320 A1 Aug. 26, 2004

(51) Int. Cl.[7] .................................................. G11B 5/39
(52) U.S. Cl. .................................................. 360/324.11
(58) Field of Search ......................... 360/324.11, 324.1, 360/313, 110

(56) References Cited

U.S. PATENT DOCUMENTS

| | | | | | |
|---|---|---|---|---|---|
| 5,465,185 | A | | 11/1995 | Heim et al. | 360/324.11 |
| 2002/0012812 | A1 | | 1/2002 | Hasegawa et al. | 428/692 |
| 2003/0103299 | A1 | * | 6/2003 | Saito | 360/324.12 |
| 2003/0137785 | A1 | * | 7/2003 | Saito | 360/324.11 |
| 2004/0136231 | A1 | * | 7/2004 | Huai et al. | 365/158 |

OTHER PUBLICATIONS

A. Tanaka et al., "Spin–valve heads in the current–perpendicular–to–plane mode for ultrahigh–density recording", IEEE Transactions on Magnetics, 38(1): 84–88 Part 1 Jan. 2000.

T. Block, C. Felser and J. Windeln, "Spin Polarized Tunneling at Room Temperature in a Huesler Compound—A non–oxide Material with a Large Negative Magnetoresistance Effect in Low magnetic Fields", presented at The 2002 IEEE International Magnetics Conference, Apr. 28–May 2, Amsterdam, The Netherlands Apr. 2002.

J.A.Caballero et al., "Magnetoresistance of NiMnSb–based multilayers and spin–valves", J. Vac. Sci. Technol. A16, 1801–1805 (1998).

K. Westerholt et al, "Exchange Bias in [Co2MnGe/Au]n, [Co2MnGe/Cr]n, and [Co2MnGe/Cu2MnAl]n Multilayers", Institute for Experimental Physics, Ruhr University, Bochurn, Germany Journal of Magnetism & Magnetic Materials, v. 257, No. 2–3, p. 239–253. Feb. 2003.

* cited by examiner

*Primary Examiner*—Julie Anne Watko
(74) *Attorney, Agent, or Firm*—Thomas R. Berthold

(57) ABSTRACT

A magnetoresistive device of the type with a pinned ferromagnetic layer and a free ferromagnetic layer separated by a nonmagnetic spacer layer has an exchange-coupled antiferromagnetic/ferromagnetic structure that uses a half-metallic ferromagnetic Heusler alloy with its near 100% spin polarization as the pinned ferromagnetic layer. The exchange-coupled structure includes an intermediate ferromagnetic layer between the AF layer and the pinned half-metallic ferromagnetic Heusler alloy layer, which results in exchange biasing. Magnetoresistive devices that can incorporate the exchange-coupled structure include current-in-the-plane (CIP) read heads and current-perpendicular-to-the-plane (CPP) magnetic tunnel junctions and read heads. The exchange-coupled structure may be located either below or above the nonmagnetic spacer layer in the magnetoresistive device.

22 Claims, 7 Drawing Sheets

A Ta(50 Å)/PtMn(200 Å)/$Co_{90}Fe_{10}$(12 Å)/$Co_2Fe_{0.4}Cr_{0.6}Al$ (45Å)/Cu(5 Å)/Ta(100 Å)
B Ta(50 Å)/PtMn(200 Å)/$Co_{90}Fe_{10}$(6 Å)/$Co_2Fe_{0.4}Cr_{0.6}Al$ (45Å)/Cu(5 Å)/Ta(100 Å)
C Ta(50 Å)/PtMn(200 Å)/$Co_2Fe_{0.4}Cr_{0.6}Al$ (45Å)/Cu(5 Å)/Ta(100 Å)

MAGNETORESISTIVE DEVICE WITH EXCHANGE-COUPLED STRUCTURE HAVING HALF-METALLIC FERROMAGNETIC HEUSLER ALLOY IN THE PINNED LAYER

TECHNICAL FIELD

This invention relates in general to magnetoresistive devices, and more particularly to magnetoresistive devices that use exchange-coupled antiferromagnetic/ferromagnetic (AF/F) structures, such as current-in-the-plane (CIP) read heads and current-perpendicular-to-the-plane (CPP) magnetic tunnel junctions and read heads.

BACKGROUND OF THE INVENTION

The exchange biasing of a ferromagnetic (F) film by an adjacent antiferromagnetic (AF) film is a phenomenon that has proven to have many useful applications in magnetic devices, and was first reported by W. H. Meiklejohn and C. P. Bean, *Phys. Rev.* 102, 1413 (1959). Whereas the magnetic hysteresis loop of a ferromagnetic single-layer film is centered about zero field, a F/AF exchange-coupled structure exhibits an asymmetric magnetic hysteresis loop which is shifted from zero magnetic field by an exchange-bias field. In addition to an offset of the magnetic hysteresis loop of the F film, the F film in a F/AF exchange-coupled structure typically shows an increased coercivity below the blocking temperature of the AF film. The blocking temperature is typically close to but below the Neel or magnetic ordering temperature of the AF film. The detailed mechanism that determines the magnitude of the exchange bias field and the increased coercive field arises from an interfacial interaction between the F and AF films.

The most common CIP magnetoresistive device that uses an exchange-coupled structure is a spin-valve (SV) type of giant magnetoresistive (GMR) sensor used as read heads in magnetic recording disk drives. The SV GMR head has two ferromagnetic layers separated by a very thin nonmagnetic conductive spacer layer, typically copper, wherein the electrical resistivity for the sensing current in the plane of the layers depends upon the relative orientation of the magnetizations in the two ferromagnetic layers. The direction of magnetization or magnetic moment of one of the ferromagnetic layers (the "free" layer) is free to rotate in the presence of the magnetic fields from the recorded data, while the other ferromagnetic layer (the "fixed" or "pinned" layer) has its magnetization fixed by being exchange-coupled with an adjacent antiferromagnetic layer. The pinned ferromagnetic layer and the adjacent antiferromagnetic layer form the exchange-coupled structure.

One type of proposed CPP magnetoresistive device that uses an exchange-coupled structure is a magnetic tunnel junction (MTJ) device that has two ferromagnetic layers separated by a very thin nonmagnetic insulating tunnel barrier spacer layer, typically alumina, wherein the tunneling current perpendicularly through the layers depends on the relative orientation of the magnetizations in the two ferromagnetic layers. The MTJ has been proposed for use in magnetoresistive sensors, such as magnetic recording disk drive read heads, and in non-volatile memory elements or cells for magnetic random access memory (MRAM). In an MTJ device, like a CIP SV GMR sensor, one of the ferromagnetic layers has its magnetization fixed by being exchange-coupled with an adjacent antiferromagnetic layer, resulting in the exchange-coupled structure.

Another type of CPP magnetoresistive device that uses an exchange-coupled structure is a SV GMR sensor proposed for use as magnetic recording read heads. The proposed CPP SV read head is structurally similar to the widely used CIP SV read head, with the primary difference being that the sense current is directed perpendicularly through the two ferromagnetic layers and the nonmagnetic spacer layer. CPP SV read heads are described by A. Tanaka et al., "Spin-valve heads in the current-perpendicular-to-plane mode for ultrahigh-density recording", *IEEE TRANSACTIONS ON MAGNETICS,* 38 (1): 84–88 Part 1 January 2002.

In these types of magnetoresistive devices, high spin polarization of the ferromagnetic materials adjacent the nonmagnetic spacer layer is essential for high magnetoresistance. The most common type of materials used for both the free and pinned ferromagnetic layers are the conventional alloys of Co, Fe and Ni, but these alloys have only relatively low spin-polarization of approximately 40%. More recently, certain half-metallic ferromagnetic Heusler alloys with near 100% spin polarization have been proposed. One such alloy is the recently reported alloy $Co_2Cr_{0.6}Fe_{0.4}Al$ (T. Block, C. Felser and J. Windeln, "Spin Polarized Tunneling at Room Temperature in a Huesler Compound—A non-oxide Material with a Large Negative Magnetoresistance Effect in Low magnetic Fields", *IEEE International Magnetics Conference*, April 28-May 2, Amsterdam, The Netherlands). Other half-metallic ferromagnetic Heusler alloys are NiMnSb and PtMnSb that have been proposed as "specular reflection" layers located within the ferromagnetic layers in CIP SV read heads, as described in published patent application U.S. Ser. No. 2002/0012812 A1. With respect to the half-metallic ferromagnetic Heusler alloy NiMnSb, no exchange bias was observed when it was deposited on a layer of FeMn antiferromagnetic material, as reported by J. A. Caballero et al., "Magnetoresistance of NiMnSb-based multilayers and spin-valves", *J. Vac. Sci. Technol.* A16, 1801–1805 (1998). In an undated article made available on the internet, exchange biasing of certain multilayers of half-metallic ferromagnetic Heusler alloys was supposedly observed without the need for exchange-coupling with an antiferromagnetic layer, as reported by K. Westerholt et al, "Exchange Bias in $[Co_2MnGe/Au]_n$, $[Co_2MnGe/Cr]_n$, and $[Co_2MnGe/Cu_2MnAl]_n$ Multilayers."

What is needed is a magnetoresistive device with an exchange-coupled structure that includes a half-metallic ferromagnetic Heusler alloy.

SUMMARY OF THE INVENTION

The invention is a magnetoresistive device with an exchange-coupled antiferromagnetic/ferromagnetic (AF/F) structure that uses a half-metallic ferromagnetic Heusler alloy with its near 100% spin polarization as the ferromagnetic (F) layer. The exchange-coupled structure includes an intermediate ferromagnetic layer between the F and AF layers, which enables the half-metallic ferromagnetic Heusler alloy F layer to exhibit exchange biasing. In one embodiment the half-metallic ferromagnetic Heusler alloy is $Co_2Fe_xCr_{(1-x)}Al$, the intermediate ferromagnetic layer is $Co_{90}Fe_{10}$ and the antiferromagnetic layer is PtMn. Magnetoresistive devices that can incorporate the exchange-coupled structure include current-in-the-plane (CIP) read heads and current-perpendicular-to-the-plane (CPP) magnetic tunnel junctions and read heads. The exchange-coupled structure may be located either below or above the nonmagnetic spacer layer in the magnetoresistive device.

For a fuller understanding of the nature and advantages of the present invention, reference should be made to the following detailed description taken together with the accompanying figures.

DETAILED DESCRIPTION OF THE INVENTION

Prior Art

Figure 1:
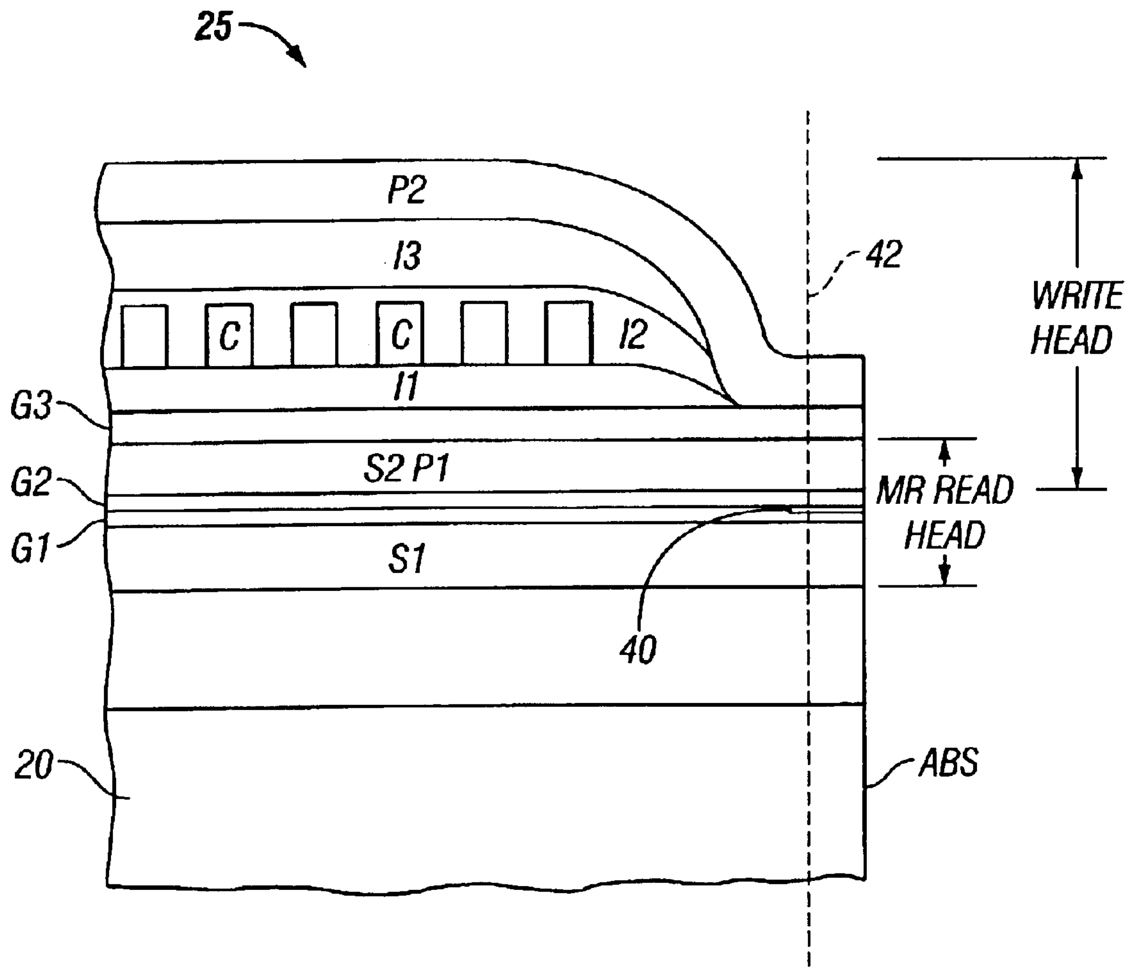
FIG. 1 is a section view of a prior art integrated read/write head that includes a magnetoresistive (MR) read head portion and an inductive write head portion.

FIG. 1 is a cross-sectional schematic view of an integrated read/write head 25 which includes a magnetoresistive (MR) read head portion and an inductive write head portion. The head 25 is lapped to form a sensing surface of the head carrier, such as the air-bearing surface (ABS) of an air-bearing slider type of head carrier. The sensing surface or ABS is spaced from the surface of the rotating disk in the disk drive. The read head includes a MR sensor 40 sandwiched between first and second gap layers G1 and G2 which are, in turn, sandwiched between first and second magnetic shield layers S1 and S2. The electrical conductors (not shown) that lead out from the MR sensor 40 to connect with sense circuitry are in contact with the MR sensor 40 and are located between MR sensor 40 and the gap layers G1, G2. The gap layers G1, G2 thus electrically insulate the electrical leads from the shields S1, S2. The write head includes a coil layer C and insulation layer 12 which are sandwiched between insulation layers I1 and I3 which are, in turn, sandwiched between first and second pole pieces P1 and P2. A gap layer G3 is sandwiched between the first and second pole pieces P1, P2 at their pole tips adjacent to the ABS for providing a magnetic gap. During writing, signal current is conducted through the coil layer C and flux is induced into the first and second pole layers P1, P2 causing flux to fringe across the pole tips at the ABS. This flux magnetizes regions of the data tracks on the rotating disk during a write operation. During a read operation, magnetized regions on the rotating disk inject flux into the MR sensor 40 of the read head, causing resistance changes in the MR sensor 40. These resistance changes are detected by detecting voltage changes across the MR sensor 40. The voltage changes are processed by the disk drive electronics and converted into user data. The combined head 25 shown in FIG. 1 is a "merged" head in which the second shield layer S2 of the read head is employed as a first pole piece P1 for the write head. In a piggyback head (not shown), the second shield layer S2 and the first pole piece P1 are separate layers. The MR sensor 40 may be a CIP SV GMR read head, an MTJ read head or a CPP SV GMR read head.

Preferred Embodiments

Figure 2A:
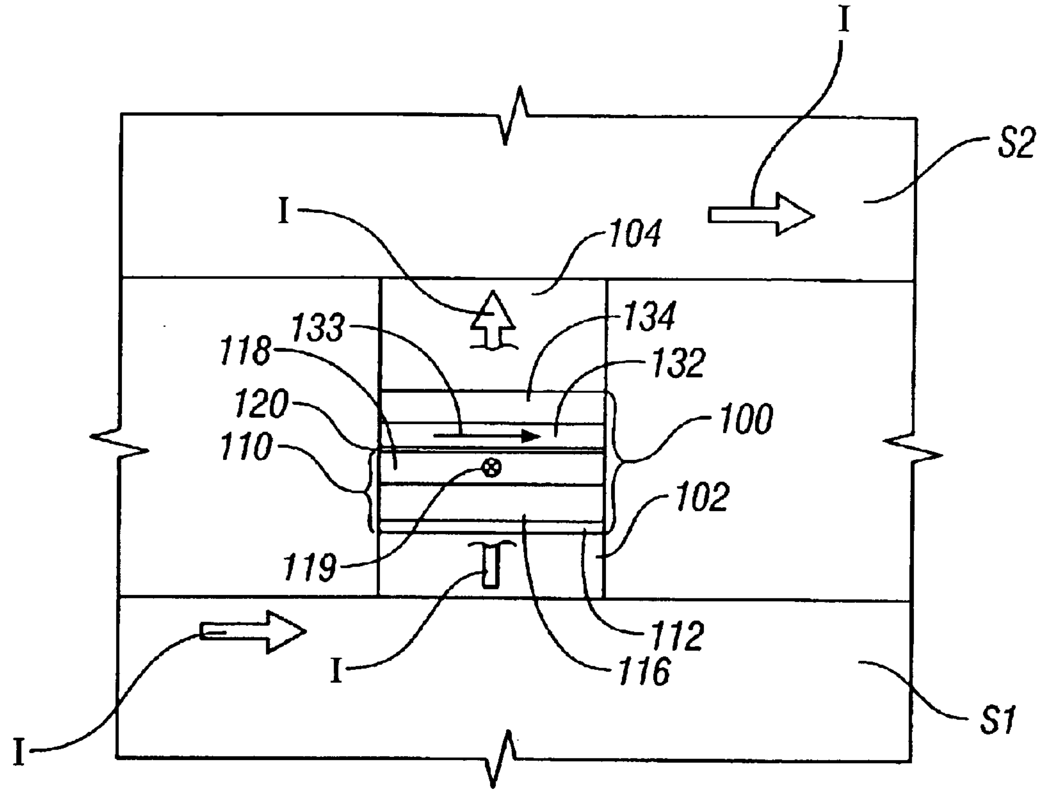
FIG. 2A is a section view of a CPP magnetoresistive device in the form of an MTJ MR read head according to the present invention as it would appear if taken through a plane whose edge is shown as line 42 in FIG. 1 and viewed from the disk surface.
Figure 2B:
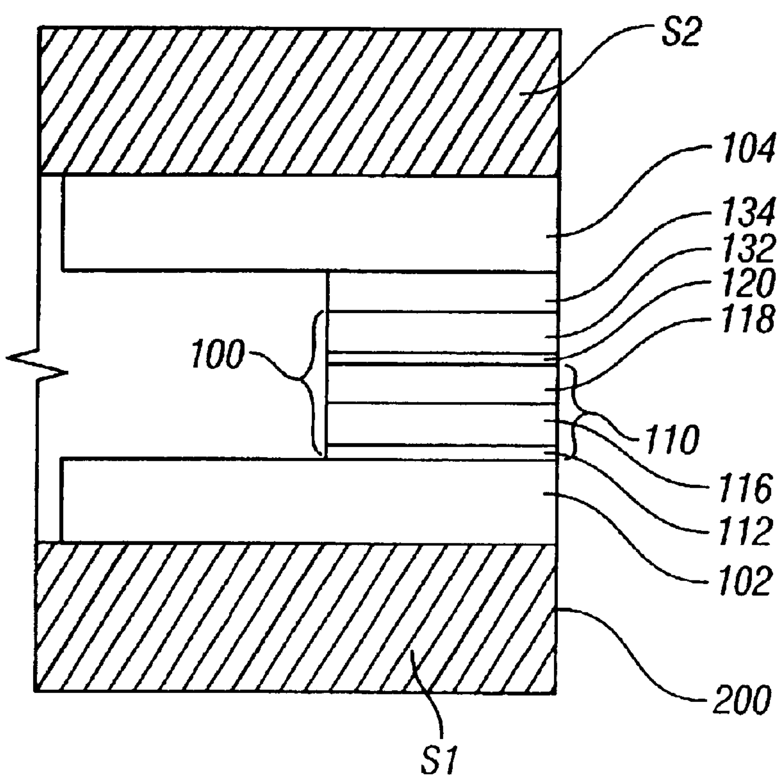
FIG. 2B is a section view perpendicular to the view of FIG. 2A and with the sensing surface of the device to the right.

FIG. 2A is a section view of a CPP magnetoresistive device in the form of an MTJ MR read head according to the present invention as it would appear if taken through a plane whose edge is shown as line 42 in FIG. 1 and viewed from the disk surface. Thus the paper of FIG. 2A is a plane parallel to the ABS and through substantially the active sensing region, i.e., the tunnel junction, of the MTJ MR read head to reveal the layers that make up the head. FIG. 2B is a section view perpendicular to the view of FIG. 2A and with the sensing surface 200 or ABS to the right. Referring to FIGS. 2A–2B, the MTJ MR read head includes an electrically conductive spacer layer 102 formed directly on the first magnetic shield S1, an electrically conductive spacer layer 104 below and in direct contact with second magnetic shield S2, and the MTJ 100 formed as a stack of layers between electrical spacer layers 0.102, 104. In this embodiment the magnetic shields S1, S2 serve both as magnetic shields and as the electrically conducting leads for connection of the MTJ 100 to sense circuitry. This is shown in FIG. 2A by the arrows showing the direction of sense current flow through the first shield S1, perpendicularly through spacer layer 102, MTJ 100, spacer layer 104 and out through the second shield S2.

The MTJ 100 includes the exchange-coupled structure 110 according to the present invention. Structure 110 includes ferromagnetic layer 118 whose magnetic moment is pinned by being exchange biased to antiferromagnetic layer 112 through intermediate ferromagnetic layer 116. The ferromagnetic layer 118 is called the fixed or pinned layer because its magnetic moment or magnetization direction (arrow 119) is prevented from rotation in the presence of applied magnetic fields in the desired range of interest. MTJ 100 also includes an insulating tunnel barrier layer 120, typically formed of alumina, on the pinned ferromagnetic layer 118 and the top free ferromagnetic layer 132 on barrier layer 120. A capping layer 134 is located on top of the free ferromagnetic layer 132. The free or sensing ferromagnetic layer 132 is not exchange-coupled to an antiferromagnetic layer, and its magnetization direction (arrow 133) is thus free to rotate in the presence of applied magnetic fields in the range of interest. The sensing ferromagnetic layer 132 is fabricated so as to have its magnetic moment or magnetization direction (arrow 133) oriented generally parallel to the ABS (the ABS is a plane parallel to the paper in FIG. 2A and is shown as 200 in FIG. 2B) and generally perpendicular to the magnetization direction of the pinned ferromagnetic layer 118 in the absence of an applied magnetic field. The magnetization direction of the pinned ferromagnetic layer 118 is oriented generally perpendicular to the ABS, i.e., out of or into the paper in FIG. 2A (as shown by arrow tail 119).

A sense current I is directed from the electrically conductive material making up the first shield S1 to first spacer layer 102, perpendicularly through the exchange-coupled structure 110, the tunnel barrier layer 120, and the sensing ferromagnetic layer 132 and then to second spacer layer 104 and out through second shield S2. In an MTJ magnetoresistive device, the amount of tunneling current through the tunnel barrier layer 120 is a function of the relative orientations of the magnetizations of the pinned and free ferromagnetic layers 118, 132 that are adjacent to and in contact with the tunnel barrier layer 120. The magnetic field from the recorded data causes the magnetization direction of free ferromagnetic layer 132 to rotate away from the direction 133, i.e., either into or out of the paper of FIG. 2A. This changes the relative orientation of the magnetic moments of the ferromagnetic layers 118, 132 and thus the amount of tunneling current, which is reflected as a change in electrical resistance of the MTJ 100. This change in resistance is detected by the disk drive electronics and processed into data read back from the disk.

In the present invention the pinned ferromagnetic layer 118 is formed of a half-metallic Heusler alloy with a near 100% spin polarization, and the intermediate layer 116 is a ferromagnetic layer in contact with the Heusler alloy material and the underlying antiferromagnetic layer 112. The antiferromagnetic layer 112 can be any antiferromagnetic material, such as PtMn, PdPtMn, RuMn, NiMn, IrMn, IrMnCr, FeMn, NiO, or CoO, and the intermediate ferromagnetic layer 116 can be any ferromagnetic alloy of one or more of Co, Ni and Fe.

This exchange-coupled structure 110 arose from the discovery that the recently reported half-metallic ferromagnetic Heusler alloy $Co_2Cr_{0.6}Fe_{0.4}Al$ does not become exchange biased when deposited directly on a layer of PtMn antiferromagnetic material. Thus, prior to the present invention it was not possible to form a conventional AF/F exchange-coupled with a half-metallic ferromagnetic Heusler alloy as the F layer.

Figure 3:
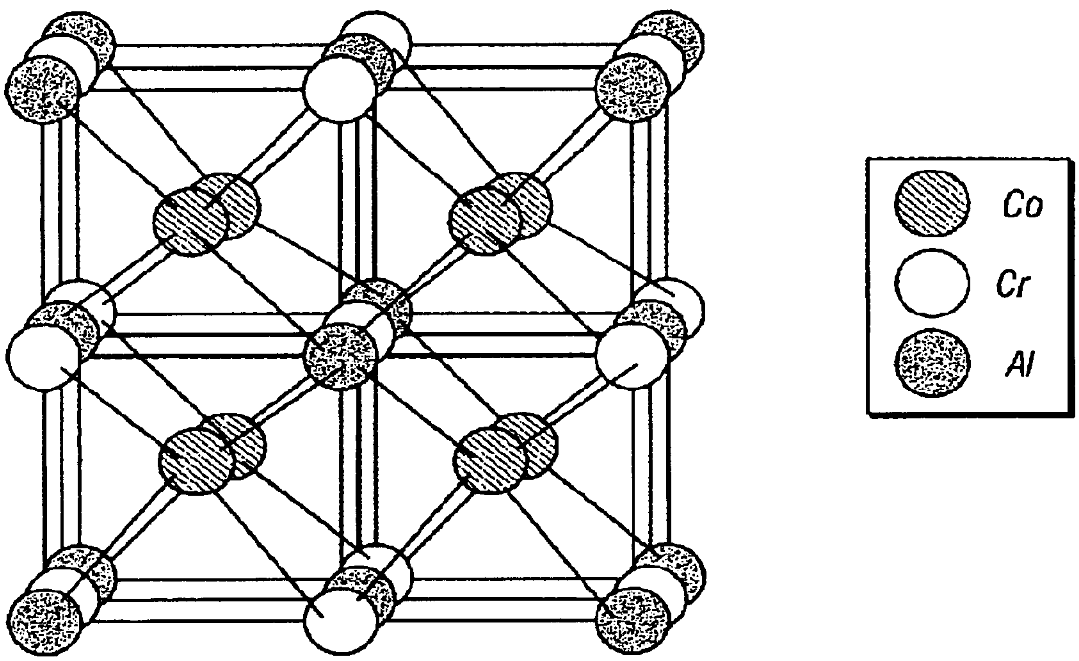
FIG. 3 is a schematic of a crystallographic unit cell for a Heusler alloy.

Heusler alloys have the chemical formula $X_2YZ$ and have a cubic $L2_1$ crystal structure. The $L2_1$ crystal structure can be described as four interpenetrating cubic closed packed structures constructed as follows: the Z atoms make up the first cubic closed packed structure, the Y atoms occupy in the octahedral sites—the center of the cube edges defined by the Z atoms, and the X atoms occupy the tetrahedral sites—the center of the cube defined by four Y and four Z atoms. FIG. 3 shows a Heusler alloy crystallographic unit cell.

The half-metallic ferromagnetic Heusler alloys known from band structure calculations are PtMnSb and NiMnSb (both are so-called half Heusler alloys because one of the X-sublattices is empty) and $Co_2MnSi$, $Mn_2VAl$, $Fe_2VAl$, $Co_2FeSi$, $Co_2MnAl$, and $Co_2MnGe$. $Co_2CrAl$ is also a half-metallic ferromagnet, since its electronic density of states at the Fermi level is finite for one spin channel, say channel 1, while it is zero for the other spin channel, say channel 2. For $Co_2CrAl$, X represents Co, Y Cr, and Z Al. It is possible to obtain a van-Hove singularity in one spin-channel 1 by doping $Co_2CrAl$ with enough electrons, so that the Fermi energy is shifted onto a peak in the density of states in spin-channel 1, while maintaining a zero density of states in spin-channel 2, so that the alloy remains half metallic. Although not necessary, using a half-metallic ferromagnet exhibiting a van-Hove singularity may be an advantage as it is present in some colossal magnetoresistance materials, which exhibit large magnetoresistance values and spin-polarized tunneling.

More recently the Heusler alloy $Co_2Fe_{0.6}Cr_{0.4}Al$ was postulated to be a half-metallic ferromagnet with a van-Hove singularity and experiments on bulk samples showed compelling evidence for high spin-polarization. In $Co_2Fe_xCr_{(1-x)}Al$ substitutional disorder among Fe and Cr atoms is present on the Y sites, which means that probabilities of an Fe or Cr atom on site Y are x and 1−x, respectively. In determining whether this material would have applications in magnetoresistive devices, thin films of $Co_{50}Fe_{10}Cr_{15}Al_{25}$ (where the subscripts represent approximate atomic percent and which thus correspond to $Co_2Fe_{0.6}Cr_{0.4}Al$) were fabricated by sputter deposition. After annealing at 250° C. for 4 hrs, these samples exhibited a magnetization close to 800 emu/cc at room temperature and a Curie temperature close to 350° C. as postulated from work on bulk samples, and were magnetically very soft (coercivity Hc typically less than 10 Oe), making them useful for applications. However, when the $Co_{50}Fe_{10}Cr_{15}Al_{25}$ films were deposited on PtMn no exchange biasing was observed. Similarly no exchange biasing was observed for NiMnSb deposited on FeMn (J. A. Caballero et al., "Magnetoresistance of NiMnSb-based multilayers and spin-valves ", *J. Vac. Sci. Technol.* A 16, 1801–1805 (1998)).

The present invention enables half-metallic ferromagnetic Heusler alloys to function as the pinned layer in exchange-coupled structures by inserting an intermediate ferromagnetic layer 116 between the antiferromagnetic layer and the half-metallic ferromagnetic Heusler alloy layer. In one embodiment a thin $Co_{90}Fe_{10}$ layer was formed between a PtMn antiferromagnetic layer and a thin $Co_2Fe_{0.6}Cr_{0.4}Al$ layer. Various samples were fabricated and compared with a sample having no intermediate ferromagnetic layer. The general structure of the samples was:

Ta(50 Å)/PtMn(200 Å)/CoFe(t)/$Co_{50}Fe_{10}Cr_{15}Al_{25}$(45 Å)/Cu(5 Å)/Ta(100 Å). The Cu layer was inserted between the $Co_{50}Fe_{10}Cr_{15}Al_{25}$ layer and the Ta capping layer to prevent Ta diffusion into the $Co_{50}Fe_{10}Cr_{15}Al_{25}$ layer. All samples were annealed at 250° C. in an external field of 1 Tesla for 4 hours.

Figure 4:
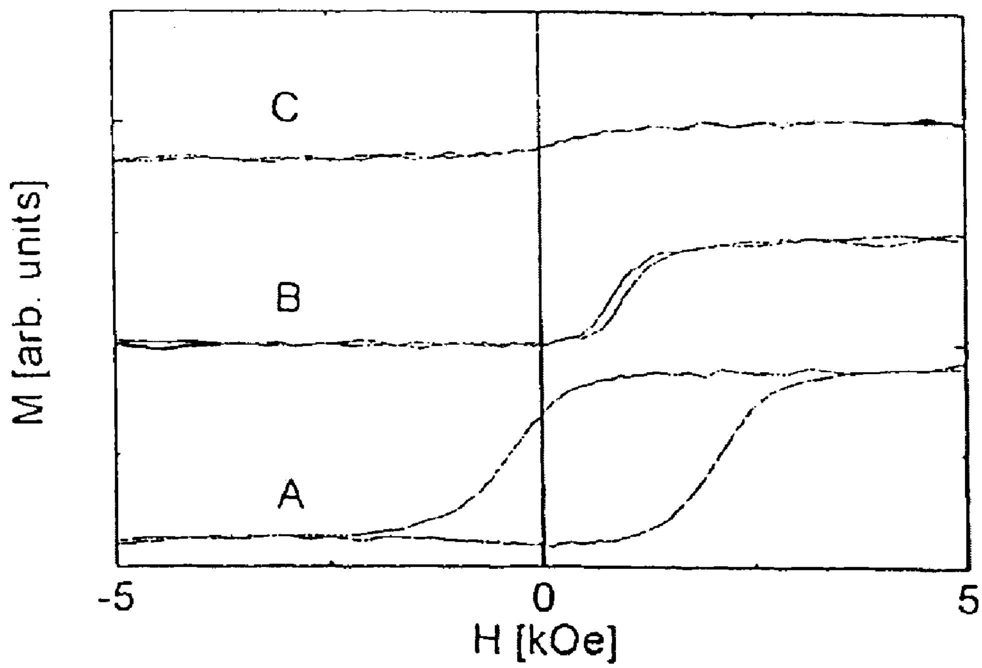
FIG. 4 shows the magnetic hysteresis loops for various samples of exchange-coupled structures according to the present invention with an intermediate ferromagnetic layer and for a structure without an intermediate ferromagnetic layer.

Magnetic hysteresis loops for the various samples are shown in FIG. 4. Loop A is for the structure without an intermediate ferromagnetic layer and shows no exchange biasing. Loop B is for the structure with a 6 Å $Co_{90}Fe_{10}$ intermediate layer and loop C is for the structure with a 12 Å $Co_{90}Fe_{10}$ intermediate layer.

Figure 5:
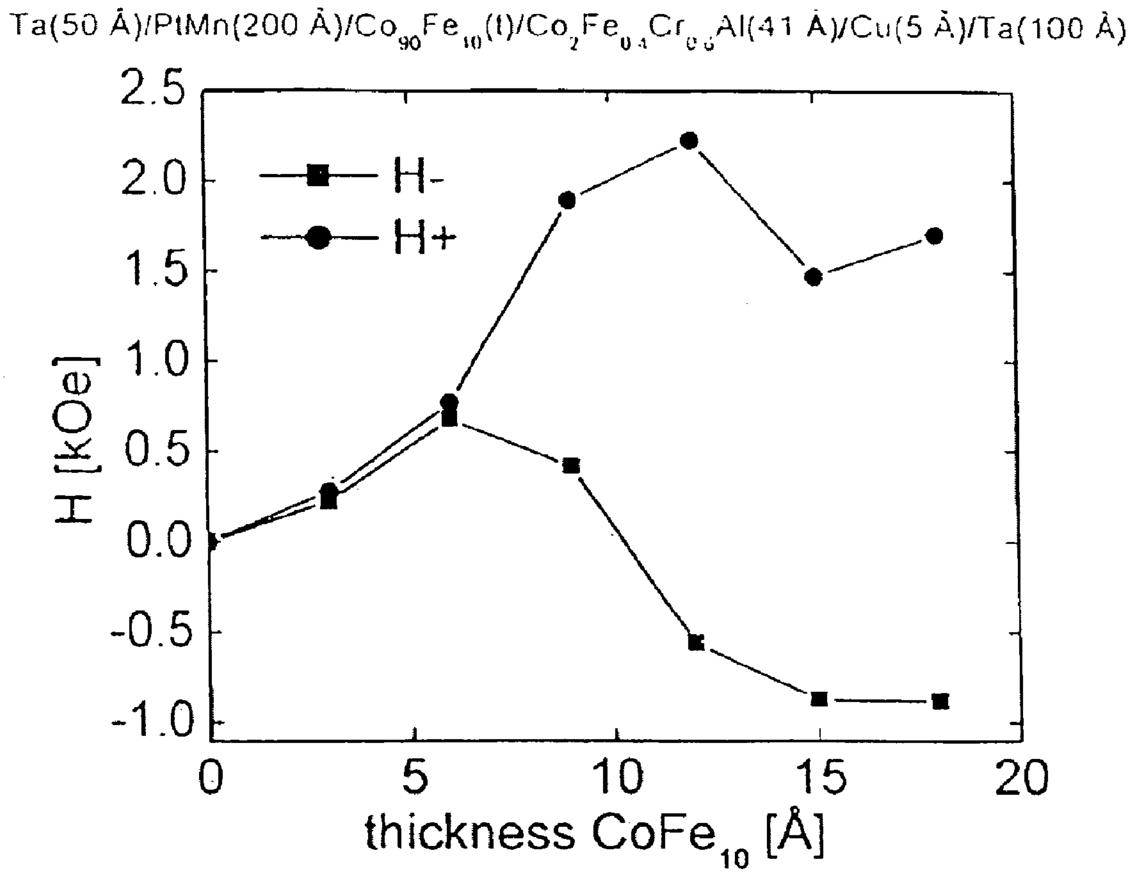
FIG. 5 shows the positive ($H^+$) and negative ($H^-$) reversal fields of the exchange-coupled structure according to the present invention as a function of the intermediate ferromagnetic layer thickness.

The effect of inserting an intermediate layer of $Co_{90}Fe_{10}$ layer is shown in FIG. 5 as a function of the intermediate ferromagnetic layer thickness for a Ta(50 Å)/PtMn(200 Å)/CoFe(t)/$CoFe_{10}Cr_{15}Al_{20}$(20 Å)/Cu(5 Å)/Ta(100 Å) sample. $H^+$ and $H^-$ denote, respectively, the positive and negative magnetic reversal fields (the magnetic fields that need to be applied to obtain a magnetization of zero) of the exchange-coupled structure. With increasing $Co_{90}Fe_{10}$ thickness the pinning field, which is $(H^++H^-)/2$, initially increases, peaks at approximately 9 Å, then decreases, while the coercivity, which is $(H^+-H^-)/2$, continuously increases.

Figure 6:
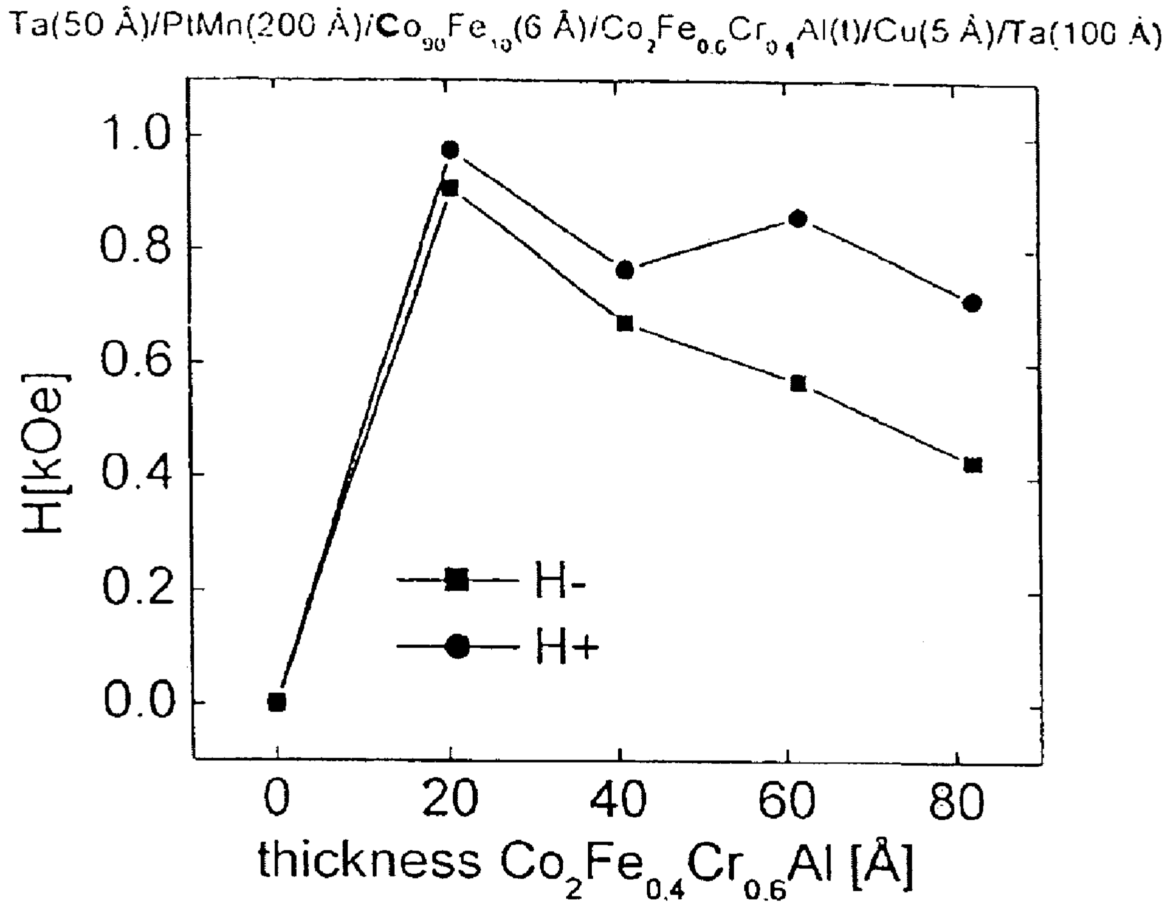
FIG. 6 shows the positive ($H^+$) and negative ($H^-$) reversal fields for the exchange-coupled structure according to the present invention as a function of the $Co_{50}Fe_{10}Cr_{15}Al_{25}$ half-metallic ferromagnetic Heusler alloy layer thickness for an intermediate $Co_{90}Fe_{10}$ layer thickness of 6 Å.
Figure 7:
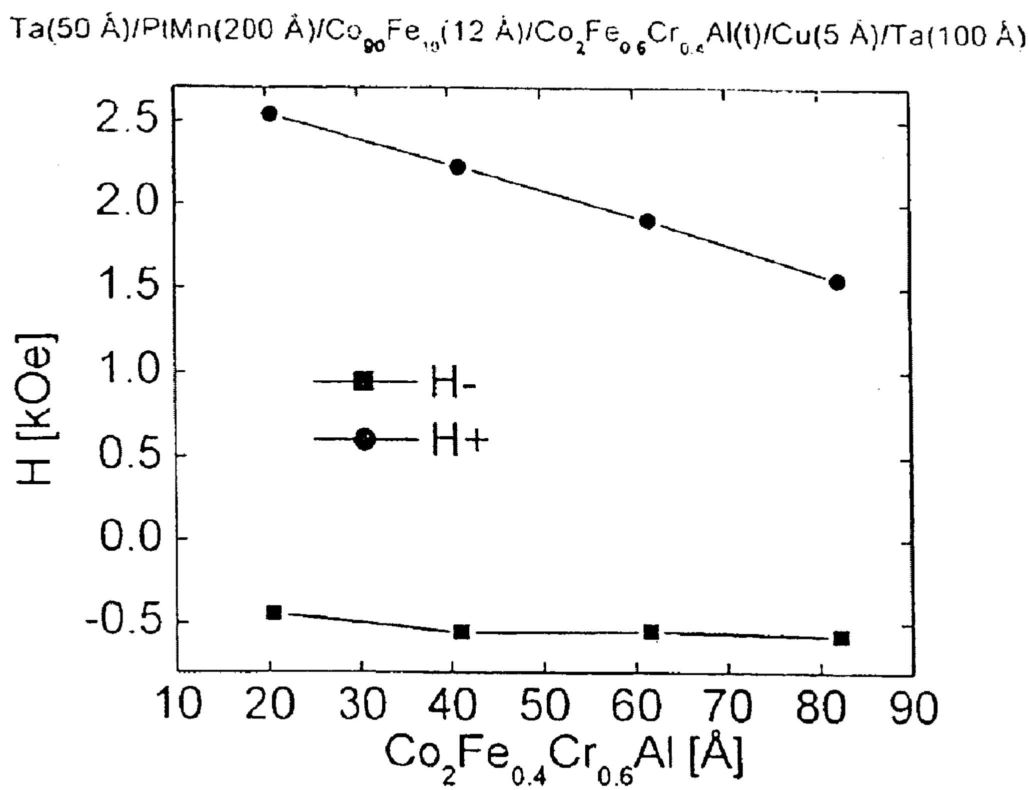
FIG. 7 shows the positive ($H^+$) and negative ($H^-$) reversal fields for the exchange-coupled structure according to the present invention as a function of the $Co_{50}Fe_{10}Cr_{15}Al_{25}$ half-metallic ferromagnetic Heusler alloy layer thickness for an intermediate $Co_{90}Fe_{10}$ layer thickness of 12 Å.

To demonstrate that the $Co_{50}Fe_{10}Cr_{15}Al_{25}$ couples ferromagnetically to the $Co_{90}Fe_{10}$ layer rather being a dead layer, $H^+$ and $H^-$ were measured for the exchange-coupled structure as a function of $Co_{50}Fe_{10}Cr_{15}Al_{25}$ layer thickness for two different $Co_{90}Fe_{10}$ layer thicknesses (FIGS. 6 and 7). For both figures, the pinning field decreases with thickness of the $Co_{50}Fe_{10}Cr_{15}Al_{25}$ layer, as expected.

The data shown and described above is for an exchange-coupled structure with a thin film composition of $Co_2Fe_{0.6}Cr_{0.4}Al$ because band structure calculations of bulk material showed that the half-metallic ferromagnetic property is achievable by substitution of approximately 40% of the Cr atoms by Fe, as reported in the previously cited T. Block et al. article. However, strains and defects are always present in thin films and can alter the band structure of a material significantly. Therefore a range of compositions is preferred: $Co_2Cr_xFe_{1-x}Al$ with 0<x<1. It is expected that this entire range of compositions is a half-metallic ferromagnet, but that a certain composition with x approximately equal to 0.6 also exhibits a van-Hove singularity in spin-channel 1.

The exchange-coupled structure 110 is shown in FIGS. 2A–2B in an MR read head embodiment of an MTJ magnetoresistive device. However, the exchange-coupled structure is also fully applicable to an MTJ memory cell. In such an application, the structure would be similar to that shown in FIG. 2A with the exception that the layers 102, 104 would function as the electrical leads connected to bit and word lines, there would be no shields S1, S2, and the magnetic moment 119 of the pinned ferromagnetic layer 118 would be oriented to be either parallel or antiparallel to the magnetic moment of the free ferromagnetic layer 132 in the absence of an applied magnetic field. In addition to its application to the MTJ type of CPP magnetoresistive device, the exchange-coupled structure 110 is also fully applicable to a CPP SV-GMR read head. In such an application the structure would be similar to that shown in FIGS. 2A–2B with the exception that the nonmagnetic spacer layer (tunnel barrier layer 120) would be formed of an electrically conducting material, typically copper.

The exchange-coupled structure is also fully applicable for use in CIP magnetoresistive devices, such as CIP SV-GMR read heads. In such an application, the structure would be similar to that shown in FIGS. 2A–2B with the exception that the layers 102, 104 would function as insulating material to electrically insulate the read head from the shields S1, S2, the nonmagnetic spacer layer 120 would be formed of an electrically conducting material, typically copper, and electrical leads would be located on the sides of the structure shown in FIG. 2A to provide sense current in the plane of the ferromagnetic layers 118, 132.

In all of the embodiments the exchange-coupled AF/F structure, the pinned F layer can be a basic bilayer structure comprising the ferromagnetic intermediate layer and a half-metallic Heusler alloy layer (as described above) or an antiferromagnetically pinned (AP) structure. In an AP structure, the pinned F layer comprises two ferromagnetic films antiferromagnetically coupled by an intermediate coupling film of metal, such as Ru, Ir, or Rh. The ferromagnetic film closest to the AF layer is exchange coupled to the AF layer and comprises the above-described bilayer structure of the intermediate ferromagnetic layer (adjacent the AF layer) and the half-metallic Heusler alloy layer (adjacent the metal coupling film). IBM's U.S. Pat. No. 5,465,185 describes the AP exchange-coupled structure.

In all of the embodiments described and shown above, the exchange-coupled structure 110 is located on the bottom of the magnetoresistive device. However, it is well known that the exchange-coupled structure can be located on the top of the device. For example, referring to FIG. 2A, the free ferromagnetic layer 132 could be located on layer 120, layer 120 on free layer 132, pinned ferromagnetic layer 118 on layer 120, intermediate ferromagnetic layer 116 on pinned layer 118, and antiferromagnetic layer 112 on top of the intermediate ferromagnetic layer 116.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive device having an exchange-coupled structure and comprising:

a substrate; and an exchange-coupled structure on the substrate, said structure comprising a layer of antiferromagnetic material, a layer of a half-metallic ferromagnetic Heusler alloy of $Co_2Fe_xCr_{(1-x)}Al$, where x is between 0 and 1, and a layer of ferromagnetic material between and in contact with the antiferromagnetic material and said alloy.

2. The device of claim 1 wherein the antiferromagnetic material is a material selected from the group consisting of PtMn, PdPtMn, RuMn, NiMn, IrMn, IrMnCr, FeMn, NiO and CoO.

3. The device of claim 1 wherein the ferromagnetic material is an alloy of one or more of Co, Ni and Fe.

4. The device of claim 1 wherein x is approximately 0.6.

5. The device of claim 1 wherein the sensor is a current-perpendicular-to-the-plane magnetoresistive sensor.

6. The device of claim 1 wherein the device is a current-in-the-plane magnetoresistive sensor.

7. The device of claim 1 wherein the device is a magnetic recording read head.

8. The device of claim 1 wherein the device is a magnetic tunnel junction device.

9. The device of claim 8 wherein the magnetic tunnel junction device is a memory cell.

10. The device of claim 8 wherein the magnetic tunnel junction device is a magnetic recording read head.

11. A magnetoresistive device comprising:

a substrate;

a ferromagnetic layer on the substrate and having its magnetic moment substantially free to rotate in the presence of an applied magnetic field;

an exchange-coupled structure on the substrate, said structure comprising a layer of antiferromagnetic material, a layer of a half-metallic ferromagnetic Heusler alloy of $Co_2Fe_xCr_{(1-x)}Al$, where x is between 0 and 1, and a layer of ferromagnetic material between and in contact with the antiferromagnetic material and said alloy, the layer of ferromagnetic alloy having its magnetic moment fixed by being exchange biased with the antiferromagnetic layer, and a nonmagnetic spacer layer between and in contact with the free ferromagnetic layer and the ferromagnetic alloy layer.

12. The device of claim 11 wherein the exchange-coupled structure is located between the substrate and the spacer layer and the free ferromagnetic layer is on top of the spacer layer.

13. The device of claim 11 wherein the free ferromagnetic layer is located between the substrate and the spacer layer and the exchange-coupled structure is on top of the spacer layer.

14. The device of claim 11 wherein the device is a magnetic tunnel junction device and wherein the spacer layer is electrically insulating.

15. The device of claim 14 wherein the magnetic tunnel junction device is a memory cell.

16. The device of claim 14 wherein the magnetic tunnel junction device is a magnetic recording read head.

17. The device of claim 11 wherein the spacer layer is electrically conductive.

18. The device of claim 17 wherein the device is a current-in-the-plane spin valve magnetic recording read head.

19. The device of claim 17 wherein the device is a current-in-perpendicular-to-the-plane spin valve magnetic recording read head.

20. The device of claim 11 wherein the antiferromagnetic material is a material selected from the group consisting of PtMn, PdPtMn, RuMn, NiMn, IrMn, IrMnCr, FeMn, NiO and CoO.

21. The device of claim 11 wherein the ferromagnetic material is an alloy of one or more of Co, Ni and Fe.

22. The device of claim 11 wherein x is approximately 0.6.

* * * * *